US012015416B2

United States Patent
Brunner

(10) Patent No.: US 12,015,416 B2
(45) Date of Patent: Jun. 18, 2024

(54) METHOD OF SYNCHRONIZING A FIXED FREQUENCY RATIO FOR A MULTI-AXIS SCANNER

(71) Applicant: Infineon Technologies AG, Neubiberg (DE)

(72) Inventor: David Brunner, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 45 days.

(21) Appl. No.: 18/051,939

(22) Filed: Nov. 2, 2022

(65) Prior Publication Data

US 2024/0146317 A1  May 2, 2024

(51) Int. Cl.
*H03K 4/62* (2006.01)
*H03L 7/099* (2006.01)
*H03L 7/10* (2006.01)

(52) U.S. Cl.
CPC ........... *H03L 7/0992* (2013.01); *H03K 4/625* (2013.01); *H03L 7/103* (2013.01)

(58) Field of Classification Search
CPC .......... H03L 7/0992; H03L 7/103; H03B 5/18
See application file for complete search history.

(56) References Cited

U.S. PATENT DOCUMENTS

2018/0231640 A1*  8/2018  Han  .................  G01S 17/931

* cited by examiner

*Primary Examiner* — Rahel Guarino
(74) *Attorney, Agent, or Firm* — Harrity & Harrity, LLP

(57) ABSTRACT

A scanning system includes an oscillator structure configured to oscillate about a first axis according to a first oscillation and oscillate about a second axis according to a second oscillation; a reference signal circuit including a digitally controlled oscillator (DCO) configured with a DCO period and configured to divide the DCO period into a plurality of equidistant slices and generate a subtiming signal that indicates the plurality of equidistant slices, a first reference signal generator configured to generate a first reference signal having a first frequency based on the subtiming signal, and a second reference signal generator configured generate a second reference signal having a second frequency based on the subtiming signal; and a driver system configured to drive the first oscillation at the first frequency based on the first reference signal and drive the second oscillation at the second frequency based on the second reference signal.

26 Claims, 5 Drawing Sheets

METHOD OF SYNCHRONIZING A FIXED FREQUENCY RATIO FOR A MULTI-AXIS SCANNER

The project leading to this application has received funding from the Electric Component Systems for European Leadership Joint Undertaking under grant agreement No. 826653. This Joint Undertaking receives support from the European Union's Horizons 2020 research and innovation program and Germany, Austria, Netherlands, France, Finland, Italy, Belgium, Czech Republic, Spain, Cyprus, Lithuania, and Turkey.

BACKGROUND

A scanning system may use two-dimensional scanning to scan one or more light beams within a field of view (FOV) according to a scanning pattern. The scanning system may use two scanning axes, including a first scanning axis that is configured to steer the one or more light beams in a first direction at a first scanning frequency and a second scanning axis that is configured to steer the one or more light beams in a second direction at a second scanning frequency. The second scanning axis is typically perpendicular to the to the first scanning axis. Different scanning patterns can be obtained by using different fixed frequency ratios between the first scanning frequency and the second scanning frequency. Synchronizing the first scanning frequency and the second scanning frequency to maintain a fixed frequency ratio is important to maintain a particular scanning pattern during a scanning operation.

SUMMARY

In some implementations, a scanning system includes an oscillator structure configured to oscillate about a first axis according to a first oscillation and oscillate about a second axis according to a second oscillation; a reference signal circuit comprising: a digitally controlled oscillator (DCO) configured with a DCO period and configured to divide the DCO period into a plurality of equidistant slices and generate a subtiming signal that indicates the plurality of equidistant slices; a first reference signal generator configured to receive the subtiming signal and generate a first reference signal having a first frequency based on the subtiming signal; and a second reference signal generator configured to receive the subtiming signal and generate a second reference signal having a second frequency based on the subtiming signal; and a driver system configured to receive the first reference signal and the second reference signal, drive the first oscillation of the oscillator structure at the first frequency based on the first reference signal, and drive the second oscillation of the oscillator structure at the second frequency based on the second reference signal.

In some implementations, a scanning system includes a first oscillator structure configured to oscillate about a first axis according to a first oscillation; a second oscillator structure configured to oscillate about a second axis according to a second oscillation; a reference signal circuit comprising: a DCO configured with a DCO period and configured to divide the DCO period into a plurality of equidistant slices and generate a subtiming signal that indicates the plurality of equidistant slices; a first reference signal generator configured to receive the subtiming signal and generate a first reference signal having a first frequency based on the subtiming signal; and a second reference signal generator configured to receive the subtiming signal and generate a second reference signal having a second frequency based on the subtiming signal; and a driver system configured to receive the first reference signal and the second reference signal, drive the first oscillation of the first oscillator structure at the first frequency based on the first reference signal, and drive the second oscillation of the second oscillator structure at the second frequency based on the second reference signal.

In some implementations, a method includes generating, by a DCO, a subtiming signal that indicates a plurality of equidistant slices of a DCO period of the DCO; generating, by a reference signal circuit, a first reference signal having a first frequency based on the subtiming signal; generating, by the reference signal circuit, a second reference signal having a second frequency based on the subtiming signal; driving, by a driver system, a first oscillation of a scanning system at the first frequency based on the first reference signal; and driving, by the driver system, a second oscillation of the scanning system at the second frequency based on the second reference signal, wherein the first frequency and the second frequency define a fixed frequency ratio.

In some implementations, a reference signal circuit includes a DCO configured with a DCO period and configured to divide the DCO period into a plurality of slices and generate a subtiming signal that indicates the plurality of slices; a first reference signal generator configured to receive the subtiming signal and generate a first reference signal having a first frequency based on the subtiming signal; and a second reference signal generator configured to receive the subtiming signal and generate a second reference signal having a second frequency based on the subtiming signal, wherein the first reference signal generator and the second reference signal generator are configured to synchronize the first reference signal and the second reference signal to the subtiming signal, respectively, and are configured to set a first fixed frequency ratio between the first frequency and the second frequency.

BRIEF DESCRIPTION OF THE DRAWINGS

Implementations are described herein making reference to the appended drawings.

DETAILED DESCRIPTION

Figure 1A:
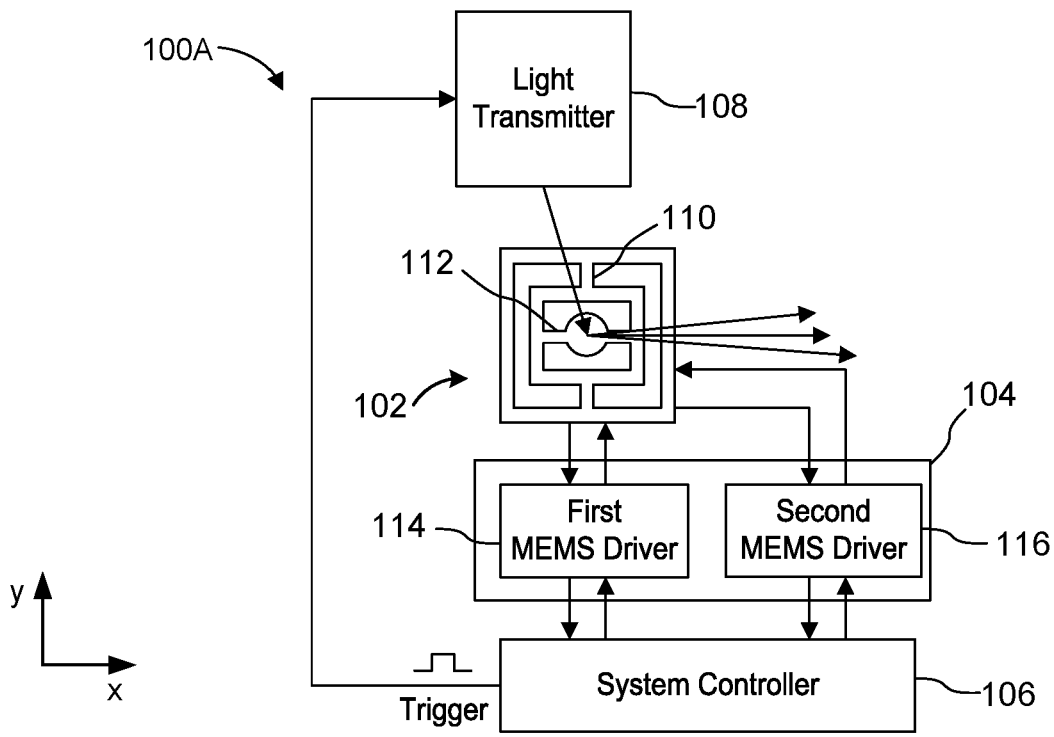
FIG. 1A is a schematic block diagram of a 2D scanning systems according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top," "bottom," "below," "above," "front," "behind," "back," "leading," "trailing," etc., may be used with reference to an orientation of the figures being described. Because parts of the implementations, described herein, can be positioned in a number of different orientations, the directional terminology is used for purposes of illustration and is in no way limiting. It is to be understood that other implementations may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

The terms "substantially" and "approximately" may be used herein to account for small manufacturing tolerances or other factors (e.g., within 5%) that are deemed acceptable in the industry or without departing from the aspects of the implementations described herein. For example, a resistor with an approximate resistance value may practically have a resistance within 5% of the approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A microelectromechanical system (MEMS) mirror can be driven about two or more scanning axes for use as a scanning device. Alternatively, two MEMS mirrors driven about a respective scanning axis may be optically coupled to form a scanning system. A MEMS mirror-based light beam scanner is one way to implement image projection technologies and object detection technologies such as Light Detection and Ranging (LIDAR). These technologies may rely on a two-dimensional (2D) scanning pattern, such as a Lissajous scanning pattern, that relies on accurately synchronized scanning axes driven at scanning frequencies that have a fixed frequency ratio. A MEMS mirror used as a scanning device can impose high effort on an implementation when considering timing constraints and limited clock frequencies in digital implementations of a synchronized control. This is because driving an oscillation of the MEMS mirror about a scanning axis with small deviations from a target resonance frequency can lead to a drastic change of an achieved scanning angle. Synchronizing oscillations about two or more scanning axis proves challenging because a small deviation at either scanning axis results in synchronization errors between the oscillations that is difficult to correct.

One approach is to derive a scanning frequency for each scanning axis using a common clock source and an individual clock divider. However, a frequency of the common clock source limits a resolution of achievable frequency steps and may necessitate fractional clock dividers, which require more chip space. In addition, if one of the clock dividers misses a clock cycle, for example, due to an error in operation, a synchronization of the scanning frequencies with respect to the fixed frequency ratio may become broken where correction is unachievable without a restart of the scanning system.

Some implementations described herein are directed to a synchronization approach that is capable of synchronizing two or more scanning frequencies to a fixed frequency ratio without the use of individual clock dividers. For example, the synchronization approach may use a time-normalized digitally controlled oscillator (DCO) to synchronize two reference signals to the fixed frequency ratio. Since both reference signals are generated by a single DCO, the fixed frequency ratio is maintained on target and synchronous operation between two or more scanning axes can be ensured. Accordingly, the synchronization approach may be more robust against synchronization errors. In addition, the synchronization approach may provide fine frequency steps with a resolution that is not limited by a frequency of a common clock source. As a result, the synchronization approach may provide higher resolutions of achievable frequency steps without using components, such as individual clock dividers, that increase chip size, thereby saving manufacturing costs and decreasing overall system complexity.

FIG. 1A is a schematic block diagram of a 2D scanning system 100A according to one or more implementations. In particular, the 2D scanning system 100A includes a microelectromechanical system (MEMS) mirror 102 implemented as a single scanning structure that is configured to steer or otherwise deflect light beams according to a 2D scanning pattern. The 2D scanning system 100A further includes a MEMS driver system 104, a system controller 106, and a light transmitter 108.

In the example shown in FIG. 1A, the MEMS mirror 102 is a mechanical moving mirror (e.g., a MEMS micro-mirror) integrated on a semiconductor chip (not shown). The MEMS mirror 102 is configured to rotate or oscillate via rotation about two scanning axes that are typically orthogonal to each other. For example, the two scanning axes may include a first scanning axis 110 that enables the MEMS mirror 102 to steer light in a first scanning direction (e.g., an x-direction) and a second scanning axis 112 that enables the MEMS mirror 102 to steer light in a second scanning direction (e.g., a y-direction). As a result, the MEMS mirror 102 can direct light beams in two dimensions according to the 2D scanning pattern and may be referred to as a 2D MEMS mirror.

A scan can be performed to illuminate an area referred to as a field of view. The scan, such as an oscillating horizontal scan (e.g., from left to right and right to left of a field of view), an oscillating vertical scan (e.g., from bottom to top and top to bottom of a field of view), or a combination thereof (e.g., a Lissajous scan or a raster scan) can illuminate the field of view in a continuous scan fashion. In some implementations, the 2D scanning system 100A may be configured to transmit successive light beams, for example, as successive light pulses, in different scanning directions to scan the field of view. In some implementation, the 2D scanning system 100A may be configured to transmit a continuous light beam, for example, as a frequency-modulated continuous-wave (FMCW), in different scanning directions to scan the field of view. In other words, the field of view can be illuminated by a scanning operation. In general, an entire field of view represents a scanning area defined by a full range of motion of the MEMS mirror 102 at which the MEMS mirror 102 is driven. Thus, the entire field of view is delineated by a left edge, a right edge, a bottom edge, and a top edge. The entire field of view can also be referred to as a field of illumination or as a projection area in a projection plane onto which an image is projected.

The MEMS mirror 102 can direct a transmitted light beam at a desired 2D coordinate (e.g., an x-y coordinate) in the field of view. In some implementations, such as Light Detection and Ranging (LIDAR), the transmitted light beam may be backscattered by an object back towards the 2D scanning system 100A as a reflected light beam where the reflected light beam is detected by a sensor. For example, the sensor may be a photodetector array. The sensor may convert the reflected light beam into an electric signal, for example, a current signal or a voltage signal, that may be further processed by the 2D scanning system 100A to generate object data or an image. In such implementations, the desired 2D coordinate may correspond to a particular transmission direction in the field of view that is targeted by the transmitted light beam for object detection, with different 2D coordinates corresponding to different transmission directions. Alternatively, in some implementations, such as image projection systems, the desired 2D coordinate may correspond to an image pixel of a projected image, with different 2D coordinates corresponding to different image pixels of the projected image.

Accordingly, multiple light beams transmitted at different transmission times or a continuous light beam can be steered by the MEMS mirror 102 at the different 2D coordinates of the field of view in accordance with the 2D scanning pattern. The MEMS mirror 102 can be used to scan the field of view in both scanning directions by changing an angle of deflection of the MEMS mirror 102 on each of the first scanning axis 110 and the second scanning axis 112.

A rotation of the MEMS mirror 102 on the first scanning axis 110 may be performed between two predetermined extremum deflection angles (e.g., +/−5 degrees, +/−15 degrees, etc.). Likewise, a rotation of the MEMS mirror 102 on the second scanning axis 112 may be performed between two predetermined extremum deflection angles (e.g., +/−5 degrees, +/−15 degrees, etc.). In some implementations, depending on the 2D scanning pattern, the two predetermined extremum deflection angles used for the first scanning axis 110 may be the same as the two predetermined extremum deflection angles used for the second scanning axis 112. In some implementations, depending on the 2D scanning pattern, the two predetermined extremum deflection angles used for the first scanning axis 110 may be different from the two predetermined extremum deflection angles used for the second scanning axis 112.

In some implementations, the MEMS mirror 102 can be a resonator (e.g., a resonant MEMS mirror) configured to oscillate side-to-side about the first scanning axis 110 at a first frequency (e.g., a first resonance frequency) and configured to oscillate side-to-side about the second scanning axis 112 at a second frequency (e.g., a second resonance frequency). Thus, the MEMS mirror 102 can be continuously driven about the first scanning axis 110 and the second scanning axis 112 to perform a continuous scanning operation. As a result, light beams reflected by the MEMS mirror 102 are scanned into the field of view in accordance with the 2D scanning pattern.

Different frequencies or a same frequency may be used for the first scanning axis 110 and the second scanning axis 112 for defining the 2D scanning pattern. For example, a raster scanning pattern or a Lissajous scanning pattern may be achieved by using different frequencies for the first frequency and the second frequency. Raster scanning and Lissajous scanning are two types of scanning that can be implemented in display applications, light scanning applications, and light steering applications, to name a few. As an example, Lissajous scanning is typically performed using two resonant scanning axes which are driven at different constant scanning frequencies with a defined fixed frequency ratio therebetween that forms a specific Lissajous pattern and frame rate. In order to properly carry out the Lissajous scanning and the raster scanning, synchronization of the two scanning axes is performed by the system controller 106 in conjunction with transmission timings of the light transmitter 108.

For each respective scanning axis, including the first scanning axis 110 and the second scanning axis 112, the MEMS mirror 102 includes an actuator structure used to drive the MEMS mirror 102 about the respective scanning axis. Each actuator structure may include interdigitated finger electrodes made of interdigitated mirror combs and frame combs to which a drive voltage (e.g., an actuation signal or driving signal) is applied by the MEMS driver system 104. Applying a difference in electrical potential between interleaved mirror combs and frame combs creates a driving force between the mirror combs and the frame combs, which creates a torque on a mirror body of the MEMS mirror 102 about the intended scanning axis. The drive voltage can be toggled between two voltages, resulting in an oscillating driving force. The oscillating driving force causes the MEMS mirror 102 to oscillate back and forth on the respective scanning axis between two extrema. Depending on the configuration, this actuation can be regulated or adjusted by adjusting the drive voltage off time, a voltage level of the drive voltage, or a duty cycle.

In other examples, the MEMS mirror 102 may use other actuation methods to drive the MEMS mirror 102 about the respective scanning axes. For example, these other actuation methods may include electromagnetic actuation and/or piezoelectric actuators. In electromagnetic actuation, the MEMS mirror 102 may be immersed in a magnetic field. and an alternating electric current through conductive paths may create the oscillating torque around the scanning axis. Piezoelectric actuators may be integrated in leaf springs of the MEMS mirror 102, or the leaf springs may be made of piezoelectric material to produce alternating beam bending forces in response to an electrical signal to generate the oscillation torque.

The MEMS driver system 104 is configured to generate driving signals (e.g., actuation signals) to drive the MEMS mirror 102 about the first scanning axis 110 and the second scanning axis 112. In particular, the MEMS driver system 104 is configured to apply the driving signals to the actuator structure of the MEMS mirror 102. In some implementations, the MEMS driver system 104 includes a first MEMS driver 114 configured to drive the MEMS mirror 102 about the first scanning axis 110 and a second MEMS driver 116 configured to drive the MEMS mirror 102 about the second scanning axis 112. In implementations in which the MEMS mirror 102 is used as an oscillator, the first MEMS driver 114 configured to drive an oscillation of the MEMS mirror 102 about the first scanning axis 110 at the first frequency, and the second MEMS driver 116 is configured to drive an oscillation of the MEMS mirror 102 about the second scanning axis 112 at the second frequency.

The first MEMS driver 114 may be configured to sense a first rotational position of the MEMS mirror 102 about the first scanning axis 110 and provide first position information indicative of the first rotational position (e.g., tilt angle or degree of rotation about the first scanning axis 110) to the system controller 106. Similarly, the second MEMS driver 116 may be configured to sense a second rotational position of the MEMS mirror 102 about the second scanning axis 112 and provide second position information indicative of the second rotational position (e.g., tilt angle or degree of rotation about the second scanning axis 112) to the system controller 106.

The system controller 106 may use the first position information and the second position information to trigger light beams at the light transmitter 108. For example, the system controller 106 may use the first position information and the second position information to set a transmission time of light transmitter 108 in order to target a particular 2D coordinate of the 2D scanning pattern. Thus, a higher accuracy in position sensing of the MEMS mirror 102 by the first MEMS driver 114 and the second MEMS driver 116 may result in the system controller 106 providing more accurate and precise control of other components of the 2D scanning system 100A.

As noted above, the first MEMS driver 114 and the second MEMS driver 116 may apply a drive voltage to a corresponding actuator structure of the MEMS mirror 102 as the driving signal to drive a rotation (e.g., an oscillation) of the MEMS mirror 102 about a respective scanning axis (e.g., the first scanning axis 110 or the second scanning axis 112). The drive voltage can be switched or toggled between a high-voltage (HV) level and a low-voltage (LV) level resulting in an oscillating driving force. In some implementations, the LV level may be zero (e.g., the drive voltage is off), but is not limited thereto and could be a non-zero value. When the drive voltage is toggled between an HV level and an LV level and the LV level is set to zero, it can be said that the drive voltage is toggled on and off (HV on/off). The oscillating driving force causes the MEMS mirror 102 to oscillate back and forth on the first scanning axis 110 or the second scanning axis 112 between two extrema. The drive voltage may be a constant drive voltage, meaning that the drive voltage is the same voltage when actuated (e.g., toggled on) or one or both of the HV level or the LV level of the drive voltage may be adjustable. However, it will be understood that the drive voltage is being toggled between the HV level and the LV level in order to produce the mirror oscillation. Depending on a configuration, this actuation can be regulated or adjusted by the system controller 106 by adjusting the drive voltage off time, a voltage level of the drive voltage, or a duty cycle. As noted above, frequency and phase of the drive voltage can also be regulated and adjusted.

In some implementations, the system controller 106 is configured to set a driving frequency of the MEMS mirror 102 for each scanning axis and is capable of synchronizing the oscillations about the first scanning axis 110 and the second scanning axis 112. In particular, the system controller 106 may be configured to control an actuation of the MEMS mirror 102 about each scanning axis by controlling the driving signals. The system controller 106 may control the frequency, the phase, the duty cycle, the HV level, and/or the LV level of the driving signals to control the actuations about the first scanning axis 110 and the second scanning axis 112. The actuation of the MEMS mirror 102 about a particular scanning axis controls its range of motion and scanning rate about that particular scanning axis.

For example, to make a Lissajous scanning pattern reproduce itself periodically with a frame rate frequency, the first frequency at which the MEMS mirror 102 is driven about the first scanning axis 110 and the second frequency at which the MEMS mirror 102 is driven about the second scanning axis 112 are different. A difference between the first frequency and the second frequency is set by a fixed frequency ratio that is used by the 2D scanning system 100A to form a repeatable Lissajous pattern (frame) with a frame rate. A new frame begins each time the Lissajous scanning pattern restarts, which may occur when a phase difference between a mirror phase about the first scanning axis 110 and a mirror phase about the second scanning axis 112 is zero. The system controller 106 may set the fixed frequency ratio and synchronize the oscillations about the first scanning axis 110 and the second scanning axis 112 to ensure this fixed frequency ratio is maintained based on the first position information and the second position information received from the first MEMS driver 114 and the second MEMS driver 116, respectively.

The light transmitter may include one or more light sources, such as one or more laser diodes or one or more light emitting diodes, for generating one or more light beams. In some implementations, the light transmitter 108 may be configured to sequentially transmit a plurality of light beams (e.g., light pulses) as the MEMS mirror 102 changes its transmission direction in order to target different 2D coordinates. The plurality of light beams may include visible light, infrared (IR) light, or other types of illumination signals, depending on an application of the 2D scanning system 100A. A transmission sequence of the plurality of light beams and a timing thereof may be implemented by the light transmitter 108 according to a trigger signal received from the system controller 106. Alternatively, in some implementations, the light transmitter 108 may be configured to transmit a continuous light beam as the MEMS mirror 102 changes its transmission direction in order to target different 2D coordinates. The continuous light beam may include visible light, IR light, or another type of illumination signal, depending on the application of the 2D scanning system 100A.

The system controller 106 is configured to control components of the 2D scanning system 100A. In certain applications, the system controller 106 may also be configured to receive programming information with respect to the 2D scanning pattern and control a timing of the plurality of light beams generated by the light transmitter 108 based on the programming information. Thus, the system controller 106 may include both processing and control circuitry that is configured to generate control signals for controlling the light transmitter 108, the first MEMS driver 114, and the second MEMS driver 116.

The system controller 106 is configured to set the driving frequencies of the MEMS mirror 102 for the first scanning axis 110 and the second scanning axis 112 and is capable of synchronizing the oscillations about the first scanning axis 110 and the second scanning axis 112 to generate the 2D scanning pattern. In some implementations, in which the plurality of light beams is used, the system controller 106 may be configured to generate the trigger signal used for triggering the light transmitter 108 to generate the plurality of light beams. Using the trigger signal, the system controller 106 can control the transmission times of the plurality of light beams of the light transmitter 108 to achieve a desired illumination pattern within the field of view. The desired illumination pattern is produced by a combination of the 2D scanning pattern produced by the MEMS mirror 102 and the transmission times triggered by the system controller 106. In some implementations in which the continuous light beam is used, the system controller 106 may be configured to control a frequency modulation of the continuous light beam via a control signal provided to the light transmitter 108.

As indicated above, FIG. 1A is provided merely as an example. Other examples are possible and may differ from what was described with regard to FIG. 1A. In practice, the 2D scanning system 100A may include additional components, fewer components, different components, or differently arranged components than those shown in FIG. 1A without deviating from the disclosure provided above. In addition, in some implementations, the 2D scanning system 100A may include one or more additional 2D MEMS mirrors or one or more additional light transmitters used to scan one or more additional field of views. Additionally, two or more components shown in FIG. 1A may be implemented within a single component, or a single component shown in FIG. 1A may be implemented as multiple, distributed components. Additionally, or alternatively, a set of components (e.g., one or more components) of the 2D scanning system 100A may perform one or more functions described as being performed by another set of components of the 2D scanning system 100A.

Figure 1B:
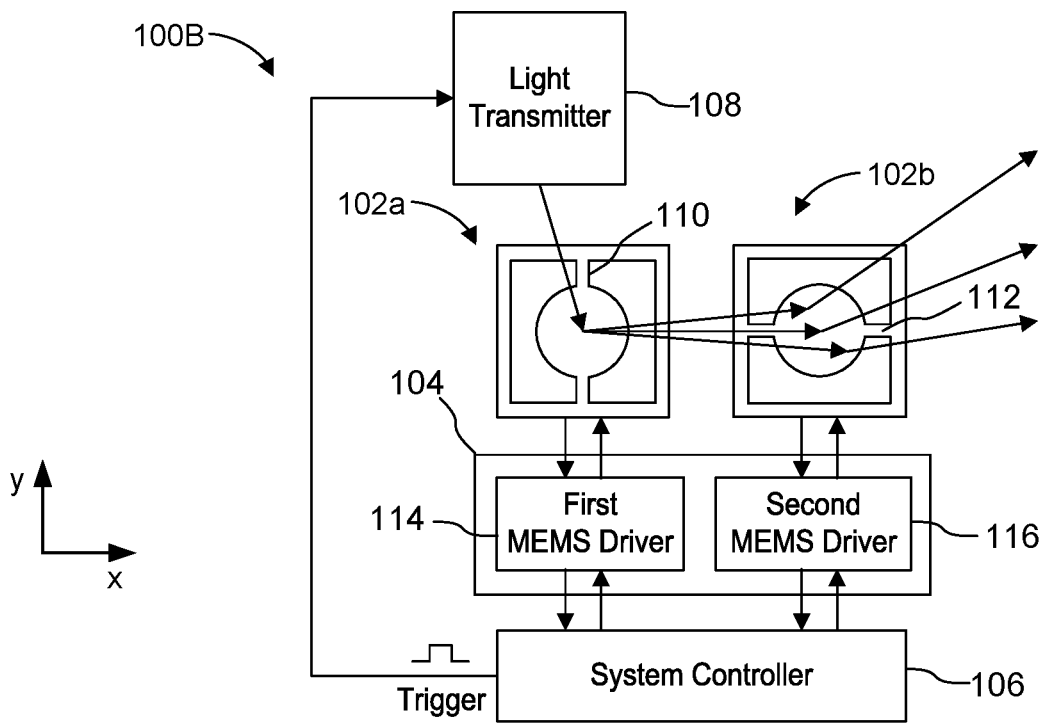
FIG. 1B is a schematic block diagram of a 2D scanning systems according to one or more implementations.

FIG. 1B is a schematic block diagram of a 2D scanning system 100B according to one or more implementations. In particular, the 2D scanning system 100B includes two MEMS mirrors, a first MEMS mirror 102a and a second MEMS mirror 102b, that are optically coupled in series to steer or otherwise deflect light beams according to a 2D scanning pattern. The first MEMS mirror 102a and the second MEMS mirror 102b are similar to the MEMS mirror 102 described in FIG. 1A, with the exception that the first MEMS mirror 102a and the second MEMS mirror 102b are configured to rotate about a single scanning axis instead of two scanning axes. The first MEMS mirror 102a is configured to rotate about the first scanning axis 110 to steer light in the x-direction and the second MEMS mirror 102b is configured to rotate about the second scanning axis 112 to steer light in the y-direction. Similar to the MEMS mirror 102 described in FIG. 1A, the first MEMS mirror 102a and the second MEMS mirror 102b may be resonant MEMS mirrors configured to oscillate about the first scanning axis 110 and the second scanning axis 112, respectively.

Because each of the first MEMS mirror 102a and the second MEMS mirror 102b is configured to rotate about a single scanning axis, each of the first MEMS mirror 102a and the second MEMS mirror 102b is responsible for scanning light in one dimension. As a result, the first MEMS mirror 102a and the second MEMS mirror 102b may be referred to as one-dimensional (1D) MEMS mirrors. In the example shown in FIG. 1B, the first MEMS mirror 102a and the second MEMS mirror 102b are used together to steer light beams in two dimensions. The first MEMS mirror 102a and the second MEMS mirror 102b are arranged sequentially along a transmission path of the light beams such that one of the MEMS mirrors (e.g., the first MEMS mirror 102a) first receives a light beam and steers the light beam in a first dimension and the second one of the MEMS mirrors (e.g., the second MEMS mirror 102b) receives the light beam from the first MEMS mirror 102a and steers the light beam in a second dimension. As a result, the first MEMS mirror 102a and the second MEMS mirror 102b operate together to steer the light beam generated by the light transmitter 108 in two dimensions. In this way, the first MEMS mirror 102a and the second MEMS mirror 102b can direct the light beam at a desired 2D coordinate (e.g., an x-y coordinate) in the field of view. Multiple light beams can be steered by the first MEMS mirror 102a and the second MEMS mirror 102b at different 2D coordinates of a 2D scanning pattern.

The MEMS driver system 104, the system controller 106, and the light transmitter 108 are configured to operate as similarly described above in reference to FIG. 1A. The first MEMS driver 114 is electrically coupled to the first MEMS mirror 102a to drive the first MEMS mirror 102a about the first scanning axis 110 and to send a position of the first MEMS mirror 102a about the first scanning axis 110 to provide first position information to the system controller 106. Similarly, the second MEMS driver 116 is electrically coupled to the second MEMS mirror 102b to drive the second MEMS mirror 102b about the second scanning axis 112 and to send a position of the second MEMS mirror 102b about the second scanning axis 112 to provide second position information to the system controller 106.

As indicated above, FIG. 1B is provided merely as an example. Other examples are possible and may differ from what was described with regard to FIG. 1B. In practice, the 2D scanning system 100B may include additional components, fewer components, different components, or differently arranged components than those shown in FIG. 1B without deviating from the disclosure provided above. In addition, in some implementations, the 2D scanning system 100B may include one or more additional 1D MEMS mirrors or one or more additional light transmitters used to scan one or more additional field of views. Additionally, two or more components shown in FIG. 1B may be implemented within a single component, or a single component shown in FIG. 1B may be implemented as multiple, distributed components. Additionally, or alternatively, a set of components (e.g., one or more components) of the 2D scanning system 100B may perform one or more functions described as being performed by another set of components of the 2D scanning system 100B.

Figure 2:
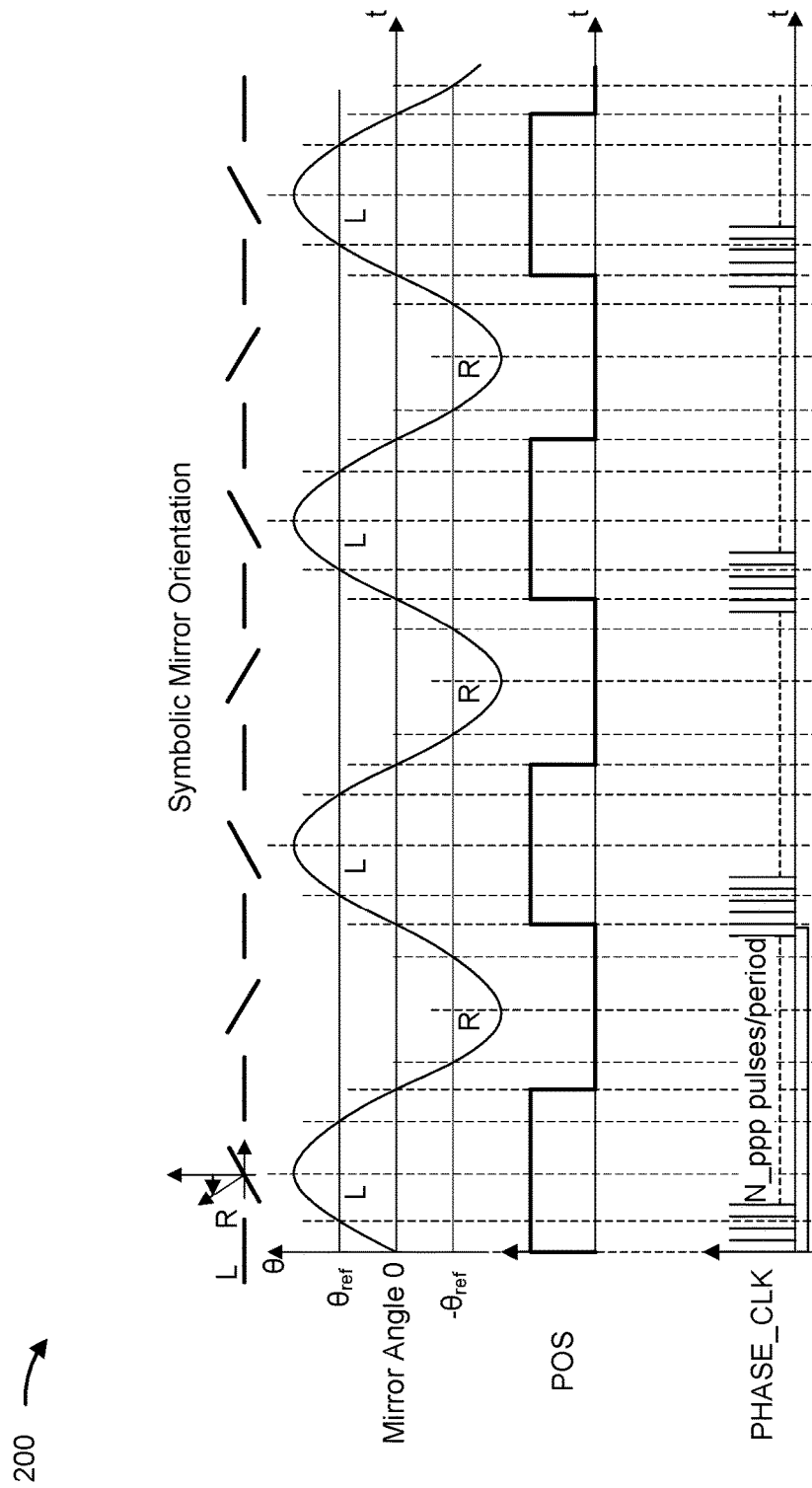
FIG. 2 is a signal diagram of various signals generated by a microelectromechanical system (MEMS) driver based on a mirror angle according to one or more implementations.

FIG. 2 is a signal diagram 200 of various signals generated by a 2D scanning system based on a mirror angle θ according to one or more implementations. The various signals include a position signal POS and a subtiming signal Phase_CLK. FIG. 2 illustrates the position signal POS and the subtiming signal Phase_CLK relative to a symbolic mirror orientation of a MEMS mirror and relative to a mirror angle trajectory of the mirror angle θ of the MEMS mirror. A positive reference angle θref and a negative reference angle −θref are used as reference angles for the mirror angle trajectory, where a positive mirror angle corresponds to the MEMS mirror tilting in a left (L) direction and a negative mirror angle corresponds to the MEMS mirror tilting in a right (R) direction.

The MEMS driver system 104 described in FIGS. 1A and 1B may generate the position signal POS for each of the scanning axes, including the first scanning axis 110 and the second scanning axis 112. For example, the first MEMS driver 114 may perform position sensing to monitor a mirror position (e.g., the mirror angle θ) about the first scanning axis 110 and generate the position signal POS corresponding to an angular trajectory about the first scanning axis 110. Similarly, the second MEMS driver 116 may perform position sensing to monitor a mirror position (e.g., the mirror angle θ) about the second scanning axis 112 and generate the position signal POS corresponding to an angular trajectory about for the second scanning axis 112. Thus, while only one position signal POS is shown in FIG. 2, it will be appreciated that the MEMS driver system 104 may generate two position signals, with each position signal POS corresponding to one of first scanning axis 110 or the second scanning axis 112.

In some implementations, the position signal POS may be square wave having a first signal transition (e.g., falling-edge transition) that is triggered at a zero-crossing as a MEMS mirror oscillates in a first rotational direction (e.g., a clockwise direction) and having a second signal transition (e.g., rising-edge transition) that is triggered at a zero-crossing as the mirror oscillates in a second rotational direction (e.g., a counter-clockwise direction). Furthermore, the position signal POS is "high" when the MEMS mirror points in one direction (e.g., points left), and the signal is "low" when the mirror points in a second direction (e.g., points right). Thus, the position signal POS not only indicates a zero-crossing event by triggering a signal transition, but also indicates absolute phase information by indicating a tilt direction of the MEMS mirror and/or a direction in which the MEMS mirror is moving of the. As intervals between zero-crossing events increase, a frequency of the position signal POS decreases. Conversely, as the intervals between zero-crossing events increase, the frequency of the position signal POS increases. Thus, the position signal POS is also representative of a frequency of the MEMS mirror about a respective scanning axis.

Alternatively, in some implementations, the position signal POS may be a pulsed signal including short signal pulses. For example, a short pulse may be generated at each zero-crossing event. In other words, the position signal POS remains low (or high) between the signal pulses. In this case, the absolute phase information indicating the direction the mirror is moving is absent.

In some implementations, the first MEMS driver 114 may receive a measurement signal to continuously sense a rotational position (e.g., angular position) about the first scanning axis 110 and generate the position signal POS for the first scanning axis 110 that is indicative of detected zero-crossing events. For example, first MEMS driver 114 may detect zero-crossing events at which a value of the measurement signal is detected to be equal to a predefined value that corresponds to a zero rotation angle about the first scanning axis 110, and generate the position signal POS that indicates each of the detected zero-crossing events corresponding to the first scanning axis 110.

Similarly, the second MEMS driver 116 may receive a measurement signal to continuously sense a rotational position about the second scanning axis 112 and generate the position signal POS for the second scanning axis 112 that is indicative of detected zero-crossing events. For example, second MEMS driver 116 may detect zero-crossing events at which a value of the measurement signal is detected to be equal to a predefined value that corresponds to a zero rotational angle about the second scanning axis 112 and generate the position signal POS that indicates each of the detected zero-crossing events corresponding to the second scanning axis 112.

In some implementations, the measurement signals used by the first MEMS driver 114 and the second MEMS driver 116 may be obtained in the following manner. As a MEMS mirror rotates, a capacitance of the actuation structure (e.g., a capacitance between interdigitated finger electrodes) may change according to the rotational position of the MEMS mirror. The first MEMS driver 114 and the second MEMS driver 116 may be configured to measure the capacitance of the actuation structure of a respective scanning axis (e.g., the first scanning axis 110 or the second scanning axis 112) and determine the rotational position therefrom. For example, as the MEMS mirror 102 moves about the first scanning axis 110, a geometry of the actuator structure corresponding to the first scanning axis 110 changes, resulting in a change in a geometry of the capacitance. As the geometry of the capacitance changes, the capacitance itself changes. Thus, a specific capacitance may correspond directly with a specific rotational position (e.g., a specific tilt angle) of the MEMS mirror 102 about the first scanning axis 110. As an example, one way to measure the capacitance is to measure a current flowing through the actuation structure, convert the current into a voltage, and then further correlate the voltage to a capacitance and/or the rotational position. However, any method to measure the capacitance may be used. A rotational direction (e.g., positive or negative, left-to-right or right-to-left, clockwise or counter-clockwise, etc.) is also detected by measuring a change in capacitance over time, where a positive or a negative change indicates opposing rotational directions.

Accordingly, the first MEMS driver 114 may be configured to sense the capacitance of the actuation structure corresponding to the first scanning axis 110 in order to monitor and track the angular trajectory of the MEMS mirror 102 about the first scanning axis 110 and determine a specific rotational position of the MEMS mirror 102 about the first scanning axis 110, including the zero-crossings. The second MEMS driver 116 may similarly sense the capacitance of the actuation structure corresponding to the second scanning axis 112 in order to monitor and track the angular trajectory of the MEMS mirror 102 about the second scanning axis 112 and determine a specific rotational position of the MEMS mirror 102 about the second scanning axis 112, including the zero-crossings.

The MEMS driver system 104 may be configured to transmit the position signal POS for each scanning axis to the system controller 106 as position information. Based on the position signal POS a phase and/or a frequency of two or more position signals POS can be compared by the system controller 106 for synchronizing oscillations about the first scanning axis 110 and the second scanning axis 112. For, example, based on the position signal POS of the first scanning axis 110, the system controller 106 may obtain at least one of phase information or frequency information of the MEMS mirror 102 about the first scanning axis 110. Similarly, based on the position signal POS of the second scanning axis 112, the system controller 106 may obtain at least one of phase information or frequency information of the MEMS mirror 102 about the second scanning axis 112. The system controller 106 may use the phase information, the frequency information, or both the phase information and the frequency information for synchronizing the oscillations about the first scanning axis 110 and the second scanning axis 112.

In addition, in some implementations, system controller 106 may use the position information to control the triggering of the light beams. The position information may also be used by the system controller 106 as feedback information such that the system controller 106 can maintain a stable operation of one or more MEMS mirrors via control signals provided to the MEMS driver system 104. The position information may also be used by the system controller 106 as feedback information such that the system controller 106 can maintain synchronization between the two or more scanning axes, including the first scanning axis 110 and the second scanning axis 112. The position information may also be used by the system controller 106 to achieve a fast Lissajous lock between two oscillations at start-up of a 2D scanner system, thus speeding up the time until the 2D scanner system is ready for transmitting the light beams.

The MEMS driver system 104 may also be configured to generate a phase clock signal Phase_CLK for each of the first scanning axis 110 and the second scanning axis 112 based on timing information indicated by the zero-crossing events of the first scanning axis 110 and the second scanning axis 112, respectively. While only one phase clock signal Phase_CLK is shown in FIG. 2, it will be appreciated that the MEMS driver system 104 may generate two phase clock signals Phase_CLK, with each phase clock signal Phase_CLK corresponding to one of the first scanning axis 110 or the second scanning axis 112.

For example, the timing information of the zero-crossing events may be provided by the position signal POS corresponding to the first scanning axis 110 and used by the first MEMS driver 114 to generate the phase clock signal Phase_CLK. The phase clock signal Phase_CLK may be generated by a digitally controlled oscillator (DCO) of the first MEMS driver 114. The DCO may divide a mirror movement about the first scanning axis 110 into equidistant slices in a time-domain. A slice may be regarded as a subsection of a time interval between two consecutive zero-crossing events. Accordingly, each slice may correspond to a phase of the mirror movement and may be referred to as a phase slice.

In some implementations, the time interval between the two consecutive zero-crossing events (e.g., between two consecutive signal transitions or signal pulses of the position signal POS) is divided by the DCO into identical fractions, and the DCO may generate a signal pulse at each fraction. Thus, the phase clock signal Phase_CLK may be a pulsed signal having a fixed number of pulses between the two consecutive zero-crossing events. A frequency of the phase clock signal Phase_CLK depends on the time interval between two consecutive zero-crossing events, with the frequency being higher for shorter time intervals and the frequency being lower for longer time intervals. Thus, the phase clock signal Phase_CLK divides the mirror movement into a well-defined number of phase-slices. As a result, the phase clock signal Phase_CLK provides a fixed number of pulses N_ppp in a mirror period that provides fine-grained phase information of the MEMS mirror 102 as the MEMS mirror 102 rotates about the first scanning axis 110.

The second MEMS driver 116 may generate the phase clock signal Phase_CLK in similarly manner for the second scanning axis 112. The MEMS driver system 104 may provide both phase clock signals Phase_CLK to the system controller 106 for synchronizing the oscillations about the first scanning axis 110 and the second scanning axis 112.

As indicated above, FIG. 2 is provided merely as an example. Other examples are possible and may differ from what was described with regard to FIG. 2. In practice, the position signal POS may be any signal capable of indicating position information, including at least one of phase information, frequency information, or zero-crossing information. Accordingly, a waveform of the position signal POS may differ from the one shown in FIG. 2. Similarly, the phase clock signal Phase_CLK may be any signal capable of indicating equidistant slices or subsections of the mirror period. Accordingly, a waveform of the phase clock signal Phase_CLK may differ from the one shown in FIG. 2.

Figure 3:
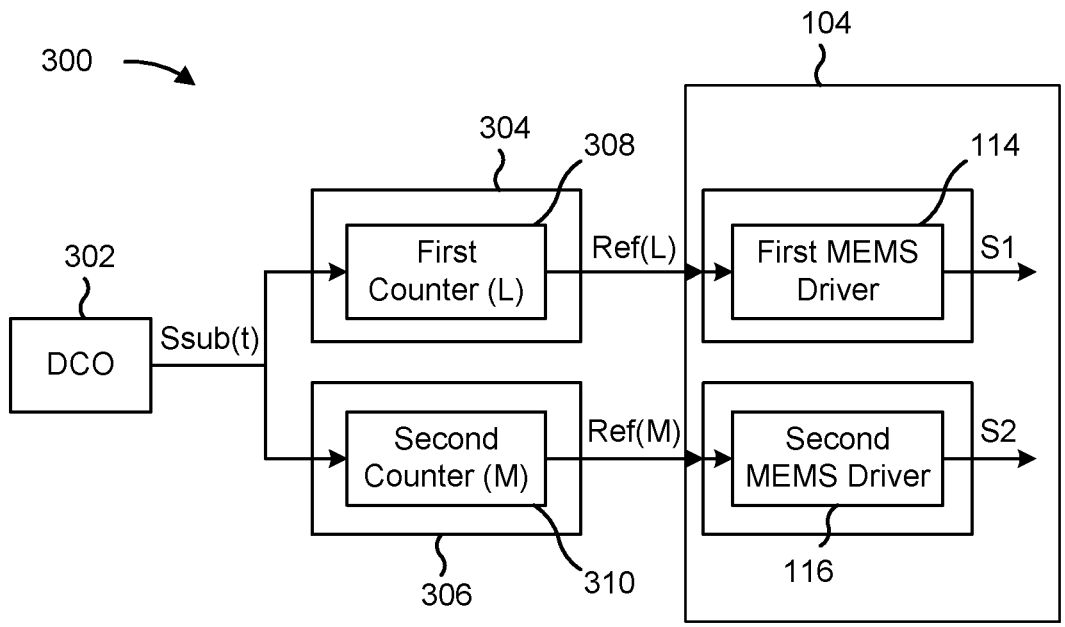
FIG. 3 is a schematic block diagram of reference signal circuit of a 2D scanning system according to one or more implementations.

FIG. 3 is a schematic block diagram of reference signal circuit 300 of a 2D scanning system according to one or more implementations. The reference signal circuit 300 includes a DCO 302, a first reference signal generator 304, and a second reference signal generator 306. The first reference signal generator 304 may be electrically coupled to the first MEMS driver 114 of the MEMS driver system 104 described in FIGS. 1A, 1B, and 2. The second reference signal generator 306 may be electrically coupled to the second MEMS driver 116 of the MEMS driver system 104 described in FIGS. 1A, 1B, and 2.

The DCO 302 may be a time-normalized DCO that is configured with a DCO period and is further configured to divide the DCO period into a plurality of equidistant slices (e.g., N slices, where N is an integer greater than one) in a time domain and generate a subtiming signal Ssub(t) that indicates the plurality of equidistant slices. In some implementations, the DCO period can correspond to a mirror period of a MEMS mirror (e.g., the MEMS mirror 102, the first MEMS mirror 102a, or the second MEMS mirror 102b) about the first scanning axis 110 or about the second scanning axis 112. For example, the DCO period can be configured to be equal to the mirror period, a fraction of the mirror period, or a multiple of the mirror period.

In some implementations, the subtiming signal Ssub(t) is a periodic signal having a period equal to the DCO period, and the subtiming signal Ssub(t) includes a plurality of subtiming values, where each period of the subtiming signal Ssub(t) is defined by a predetermined number of subtiming values, and where each subtiming value of the plurality of subtiming values indicates a respective equidistant slice of the plurality of equidistant slices. For example, the DCO 302 may increment an amplitude of the subtiming signal Ssub(t) in steps by a predetermined amount for each increment, where a different subtiming value is generated after each increment. The DCO 302 may reset the amplitude of the subtiming signal Ssub(t) to, for example, zero, to start a new DCO period. Accordingly, the DCO 302 may increment or count the subtiming values from zero to a maximum value corresponding to an Nth slice of the DCO period. As a result, the subtiming signal Ssub(t) may have a saw-tooth waveform.

In some implementations, the subtiming signal Ssub(t) is a pulsed signal having a plurality of pulses that indicate the plurality of equidistant slices, where each period of the subtiming signal Ssub(t) is defined by a predetermined number of pulses, and where each pulse of the plurality of pulses indicates a respective equidistant slice of the plurality of equidistant slices. For example, the subtiming signal Ssub(t) may be similar to the phase clock signal PHASE_CLK described above in FIG. 2. In some implementations, the DCO 302 is a DCO of the first MEMS driver 114 or a DCO of the second MEMS driver 116, and the phase clock signal PHASE_CLK may be used as the subtiming signal Ssub(t). In some implementations, the DCO 302 is a different from the DCOs of the first MEMS driver 114 and the second MEMS driver 116.

The first reference signal generator 304 is configured to receive the subtiming signal Ssub(t) and generate a first reference signal Ref(L) having a first frequency f1 based on the subtiming signal Ssub(t). The first reference signal Ref(L) has a first plurality of transition edges (e.g., rising transition edges and falling transition edges that alternate to form a square wave) that define the first frequency f1. For example, the first reference signal generator 304 may include a first counter 308 that is configured to trigger a different one of the first plurality of transition edges at every L consecutive subtiming values of the plurality of subtiming values, where L is a first integer greater than zero. In some implementations, the first integer L is equal to N (e.g., L=N), but is not limited thereto.

The second reference signal generator 306 is configured to receive the subtiming signal Ssub(t) and generate a second reference signal Ref(M) having a second frequency f2 based on the subtiming signal Ssub(t). The second reference signal Ref(M) has a second plurality of transition edges (e.g., rising transition edges and falling transition edges that alternate to form a square wave) that define the second frequency f2. For example, the second reference signal generator 306 may include a second counter 310 that is configured to trigger a different one of the second plurality of transition edges at every M consecutive subtiming values of the plurality of subtiming values, where M is a second integer greater than zero and different from the first integer L. As a result of the first integer L and the second integer M being different, the first integer L and the second integer M define a fixed ratio that is used by the reference signal circuit 300 as a fixed frequency ratio between the first frequency f1 and the second frequency f2. In some implementations, the fixed frequency ratio is used to define a Lissajous pattern for a scanning operation.

In some implementations, the first reference signal generator 304 may add a first initial phase offset to the first reference signal Ref(L) and/or the second reference signal generator 306 may add a second initial phase offset to the second reference signal Ref(M) such that the first reference signal Ref(L) and the second reference signal Ref(M) are phase-shifted relative to each other with a phase offset. In other words, the first reference signal Ref(L) and the second reference signal Ref(M) may be generated in-phase or out-of-phase relative to each other. Accordingly, the first reference signal generator 304 and/or the second reference signal generator 306 may include a phase shifter or a delay component to implement a phase shift.

The first reference signal generator 304 and the second reference signal generator 306 are configured to receive the subtiming signal Ssub(t) in parallel such that the first reference signal Ref(L) and the second reference signal Ref(M) are generated in parallel and simultaneously output to the MEMS driver system 104. The MEMS driver system 104 is configured to receive the first reference signal Ref(L) and the second reference signal Ref(M), drive a first oscillation of a MEMS mirror (e.g., the MEMS mirror 102 or the first MEMS mirror 102a) about the first scanning axis 110 at the first frequency f1 based on the first reference signal Ref(L), and drive a second oscillation of a MEMS mirror (e.g., the MEMS mirror 102 or the second MEMS mirror 102b) about the second scanning axis 112 at the second frequency f2 based on the second reference signal Ref(M). For example, the first MEMS driver 114 may generate a first driving signal S1 to synchronize the first oscillation about the first scanning axis 110 with the first frequency f1 of the first reference signal Ref(L), and the second MEMS driver 116 may generate a second driving signal S2 to synchronize the second oscillation about the second scanning axis 112 with the second frequency f2 of the second reference signal Ref(M).

As a result, the first reference signal generator 304 and the second reference signal generator 306 are configured to synchronize the first reference signal Ref(L) and the second reference signal Ref(M) to the subtiming signal Ssub(t), respectively, and are configured to set the fixed frequency ratio between the first frequency f1 and the second frequency f2 such that the fixed frequency ratio remains constant. Synchronization errors between the first reference signal Ref(L) and the second reference signal Ref(M) that may cause an error in the fixed frequency ratio can be avoided. In particular, by using a single subtiming signal (e.g., the subtiming signal Ssub(t)) to derive both the first reference signal Ref(L) and the second reference signal Ref(M), the synchronization errors can be avoided, and the fixed frequency ratio can be maintained constant at its intended value. For example, any error present in the subtiming signal Ssub(t) would impact the first reference signal Ref(L) and the second reference signal Ref(M) in a same manner, thereby maintaining the synchronization of the first reference signal Ref(L) and the second reference signal Ref(M) to the fixed frequency ratio, even in situations where an error occurs in the subtiming signal Ssub(t). In addition, dividing the DCO period into the equidistant slices enables the reference signal circuit 300 to set the fixed frequency ratio using the first integer L and the second integer M. Fine frequency steps are possible, which provides precise control over the first frequency f1 and the second frequency f2 and enables higher resolutions of achievable frequency steps. Accordingly, the fixed frequency ratio is entirely configurable and can be used to generate different scanning patterns.

In addition, in some implementations, the first integer L and the second integer M may be equal such that the first frequency f1 and the second frequency f2 are equal. In some implementations, the first frequency f1 and the second frequency f2 may be equal, but the first reference signal Ref(L) and the second reference signal Ref(M) may be offset in phase. In some implementations, the first frequency f1 and the second frequency f2 may be equal, and the first reference signal Ref(L) and the second reference signal Ref(M) may be synchronized in phase. Accordingly, the reference signal circuit 300 is capable of synchronizing the first reference signal Ref(L) and the second reference signal Ref(M) in a variety of ways to satisfy the design objectives of a system.

As indicated above, FIG. 3 is provided merely as an example. Other examples are possible and may differ from what was described with regard to FIG. 3. In practice, the reference signal circuit 300 may include additional components, fewer components, different components, or differently arranged components than those shown in FIG. 3 without deviating from the disclosure provided above. Additionally, two or more components shown in FIG. 3 may be implemented within a single component, or a single component shown in FIG. 3 may be implemented as multiple, distributed components. Additionally, or alternatively, a set of components (e.g., one or more components) of the reference signal circuit 300 may perform one or more functions described as being performed by another set of components of the reference signal circuit 300.

Figure 4:
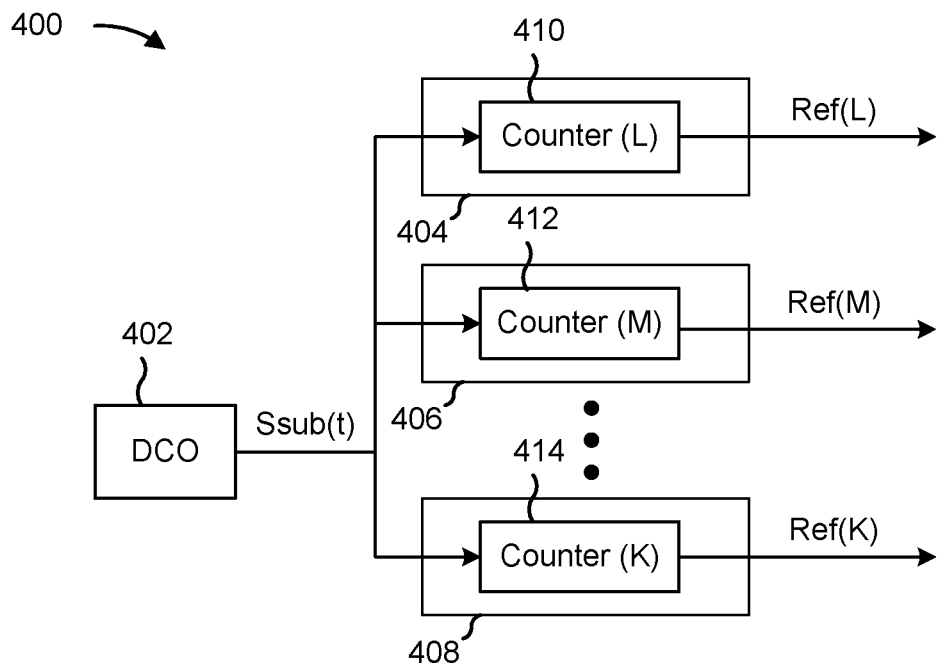
FIG. 4 is a schematic block diagram of reference signal circuit according to one or more implementations.

FIG. 4 is a schematic block diagram of reference signal circuit 400 according to one or more implementations. The reference signal circuit 400 includes a DCO 402, a first reference signal generator 404, and a second reference signal generator 406, and a third reference signal generator 408. In practice, the reference signal circuit 400 may include four or more reference signal generators, each electrically coupled to the DCO 402 for receiving a subtiming signal Ssub(t) therefrom. The DCO 402 and the subtiming signal Ssub(t) may be similar to the DCO 302 and the subtiming signal Ssub(t) described above for FIG. 3. Similarly, the first reference signal generator 404 and the second reference signal generator 406 may be similar to the first reference signal generator 304 and the second reference signal generator 306 described above for FIG. 3. Accordingly, the first reference signal generator 404 may include a first counter 410 configured to trigger transition edges of the first reference signal Ref(L) at every L consecutive subtiming values of the plurality of subtiming values of the subtiming signal Ssub(t), and the second reference signal generator 406 may include a second counter 412 configured to trigger transition edges of the second reference signal Ref(M) at every M consecutive subtiming values of the plurality of subtiming values of the subtiming signal Ssub(t).

Additionally, the third reference signal generator 408 is configured to receive the subtiming signal Ssub(t) and generate a third reference signal Ref(K) having a third frequency f3 based on the subtiming signal Ssub(t). The third reference signal Ref(K) has a third plurality of transition edges (e.g., rising transition edges and falling transition edges that alternate to form a square wave) that define the third frequency f3. For example, the third reference signal generator 408 may include a third counter 414 that is configured to trigger a different one of the third plurality of transition edges at every K consecutive subtiming values of the plurality of subtiming values, where K is a third integer greater than zero. Accordingly, the third reference signal generator 408 is configured to synchronize the third reference signal Ref(K) to the subtiming signal Ssub(t).

In some implementations, the third integer K is equal to N, L, and/or M (e.g., K=N, K=L, and/or K=M). In some implementations, the first integer L, the second integer M, and the third integer K are different. Thus, the first integer L, the second integer M, and the third integer K are entirely configurable and may be used define a first fixed frequency ratio between the first reference signal Ref(L) and the second reference signal Ref(M), a second fixed frequency ratio between the second reference signal Ref(M) and the third reference signal Ref(K), and a third fixed frequency ratio between the first reference signal Ref(L) and the third reference signal Ref(K). In some implementations, the third reference signal Ref(K) may be used for an additional 2D MEMS mirror or an additional 1D MEMS mirror. For example, the third reference signal Ref(K) may be used for deriving a driving signal therefrom used for driving a third oscillation about a third scanning axis at the third frequency f3. Additional reference signal generators may be provided to drive oscillations about additional scanning axes. Additionally, the reference signal circuit 400 may be implemented in any system that uses reference signals having a fixed frequency ratio, where the fixed frequency ratio could be equal to one or different than one.

In addition, in some implementations, the first integer L and the second integer M may be equal such that the first frequency f1 and the second frequency f2 are equal. In some implementations, the first frequency f1 and the second frequency f2 may be equal, but the first reference signal Ref(L) and the second reference signal Ref(M) may be offset in phase. In some implementations, the first frequency f1 and the second frequency f2 may be equal, and the first reference signal Ref(L) and the second reference signal Ref(M) may be synchronized in phase. Accordingly, the reference signal circuit 400 is capable of synchronizing the first reference signal Ref(L) and the second reference signal Ref(M) in a variety of ways to satisfy the design objectives of a system. In addition, similar frequency and phase considerations may be applied to the third reference signal Ref(K) relative to the first reference signal Ref(L) and the second reference signal Ref(M).

As indicated above, FIG. 4 is provided merely as an example. Other examples are possible and may differ from what was described with regard to FIG. 4. In practice, the reference signal circuit 400 may include additional components, fewer components, different components, or differently arranged components than those shown in FIG. 4 without deviating from the disclosure provided above. Additionally, two or more components shown in FIG. 4 may be implemented within a single component, or a single component shown in FIG. 4 may be implemented as multiple, distributed components. Additionally, or alternatively, a set of components (e.g., one or more components) of the reference signal circuit 400 may perform one or more functions described as being performed by another set of components of the reference signal circuit 400.

Figure 5:
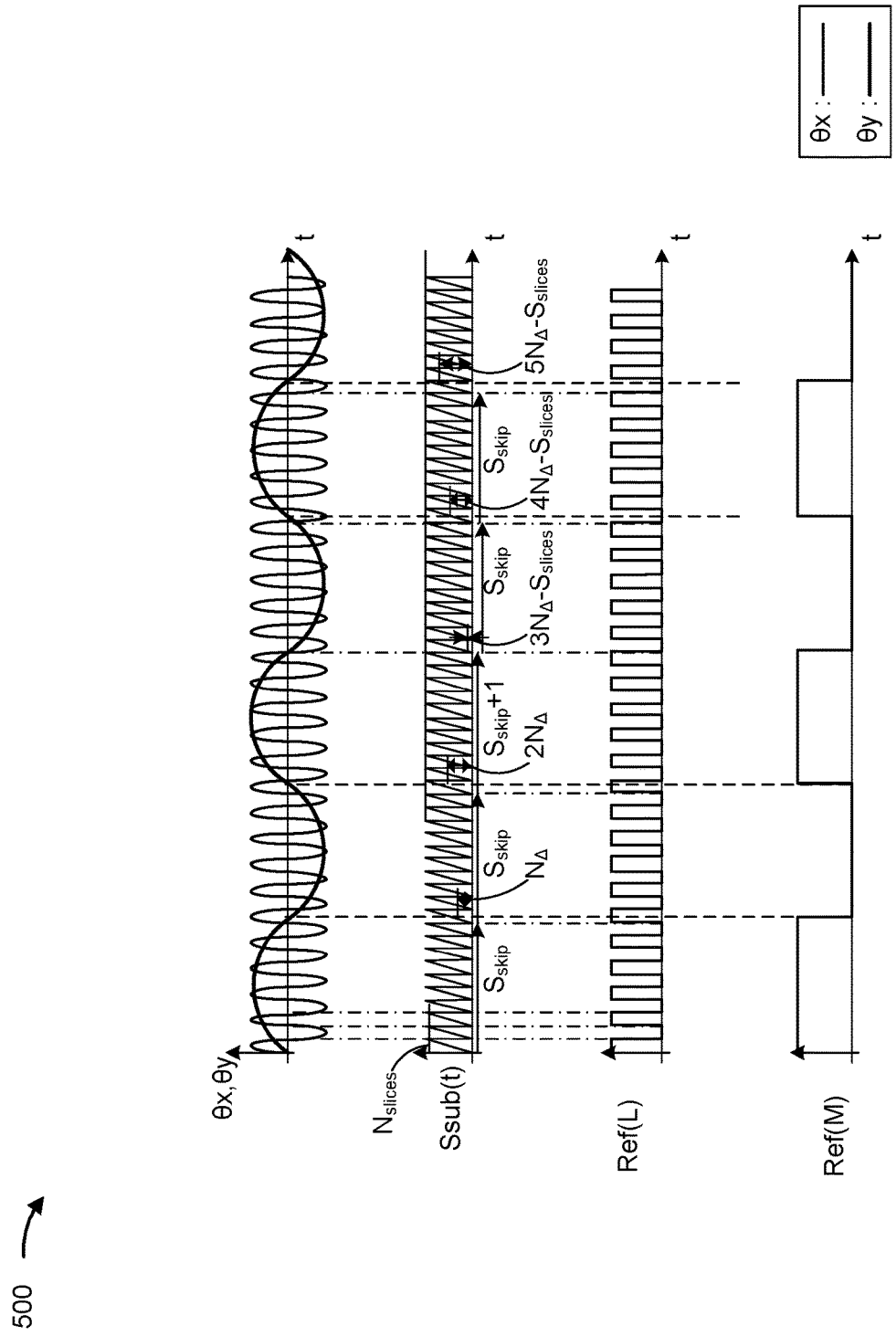
FIG. 5 is a signal diagram of various signals generated by a reference signal circuit 400 according to one or more implementations.

FIG. 5 is a signal diagram 500 of various signals generated by a reference signal circuit according to one or more implementations. The various signals include the subtiming signal Ssub(t), the first reference signal Ref(L), and the second reference signal Ref(M) described above. The subtiming signal Ssub(t), the first reference signal Ref(L), and the second reference signal Ref(M) are shown relative to a mirror angle θx (e.g., a first angular trajectory) about the first scanning axis 110 and a mirror angle θy (e.g., a second angular trajectory) about the second scanning axis 112. The subtiming signal Ssub(t) has a saw-tooth waveform having N slices per DCO period, with a maximum value of $N_{slices}$. In some implementations, a DCO (e.g., DCO 302 or DCO 402) counts subtiming values in DCO subtiming increments from 0 to the maximum value $N_{slices}$ and resets to 0 to start a new DCO period, resulting in a sawtooth-like output running with a DCO frequency $f_{DCO}$. Hence, a subtiming value of the subtiming signal Ssub(t) represents a specific fraction of the DCO period and can be interpreted as a phase of the DCO period. Such a DCO structure can achieve fine frequency steps.

A fixed frequency ratio between two scanning axes uses constant increments of a first scanning axis relative phase per second scanning axis half period as $\Delta\phi=\pi f1/f2$, with the first frequency f1 and the second frequency f2. Hence, the DCO subtiming increments for a fixed frequency ratio can be derived by $\Delta N=N_{slices} \cdot f_{DCO}/fx$, with $\Delta N$ being the DCO subtiming increment between consecutive subtiming values of the subtiming signal Ssub(t) and with fx being a target frequency (e.g., the first frequency f1 or the second frequency f2).

In the example, shown in FIG. 5, the DCO frequency is set to twice the first frequency f1 (e.g., a frequency of the first reference signal Ref(L)) can be directly derived by the DCO frequency by toggling the first reference signal Ref(L) every DCO period. To achieve frequency ratios $$\frac{f_{DCO}}{f_x}$$

not of an integer value, the submitting signal Ssub(t) is used. The second reference signal Ref(M) is obtained by toggling the second reference signal Ref(M) every M slices. In an example implementation, this can be obtained by separating the DCO subtiming increments ΔN into a number of skipped DCO periods $$S_{skip} = \left\lfloor \frac{f_{DCO}}{f2} \right\rfloor$$

and a residual subtiming increment per second axis half period $$N_\Delta = N_{slices}\left(\frac{f_{DCO}}{f2} - \left\lfloor \frac{f_{DCO}}{f2} \right\rfloor\right),$$

such that $\Delta N = S_{skip} N_{slices} + N_\Delta$. If a number of accumulated subtiming increments overflow $N_{slices}$, an additional DCO period is skipped as shown in FIG. 5. As both the first reference signal Ref(L) and the second reference signal Ref(M) are generated by the same DCO subtiming, the frequency ratio between first reference signal Ref(L) and the second reference signal Ref(M) is maintained constant and synchronous operation is ensured, while also fine frequency steps are possible. This method can be extended by adding more MEMS mirrors and/or more scanning axes.

As indicated above, FIG. 5 is provided merely as an example. Other examples are possible and may differ from what was described with regard to FIG. 5. In practice, the subtiming signal Ssub(t) may be any signal capable of indicating equidistant slices or subsections of the DCO period. Accordingly, a waveform of the subtiming signal Ssub(t) may differ from the one shown in FIG. 5. In addition, the first reference signal Ref(L) and the second reference signal Ref(M) may be configured with different frequencies than the frequencies shown in FIG. 5.

Figure 6:
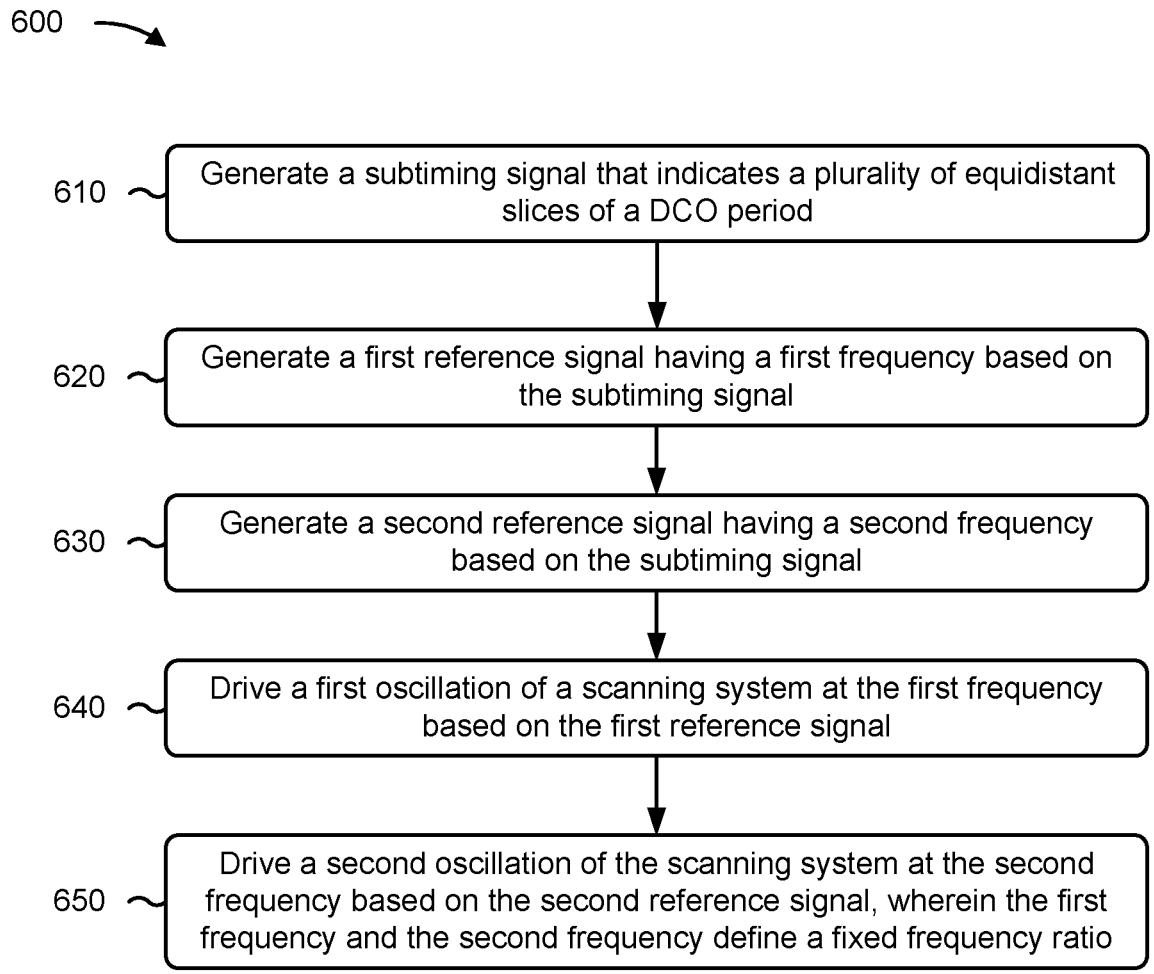
FIG. 6 is a flowchart of an example process associated with a method of synchronizing a fixed frequency ratio for a multi-axis scanner.

FIG. 6 is a flowchart of an example process 600 associated with a method of synchronizing a fixed frequency ratio for a multi-axis scanner. In some implementations, one or more process blocks of FIG. 6 are performed by a reference signal circuit (e.g., reference signal circuit 300). In some implementations, one or more process blocks of FIG. 6 are performed by another system, another device, or a group of devices separate from or including the reference signal circuit, such as 2D scanning system 100A, 2D scanning system 100B, or reference signal circuit 400. Additionally, or alternatively, one or more process blocks of FIG. 6 may be performed by one or more components of reference signal circuit 300, 2D scanning system 100A, 2D scanning system 100B, and/or reference signal circuit 400, such as a DCO (e.g., DCO 302), a first reference signal generator (e.g., first reference signal generator 304), a second reference signal generator (e.g., second reference signal generator 306), a driver system (e.g., MEMS driver system 104), and/or a system controller (e.g., system controller 106).

As shown in FIG. 6, process 600 may include generating a subtiming signal that indicates a plurality of equidistant slices of a DCO period of a DCO (block 610). For example, the DCO 302 may generate a subtiming signal that indicates a plurality of equidistant slices of a DCO period of the DCO 302, as described above.

As further shown in FIG. 6, process 600 may include generating a first reference signal having a first frequency based on the subtiming signal (block 620). For example, the first reference signal generator 304 of the reference signal circuit 300 may generate a first reference signal having a first frequency based on the subtiming signal, as described above.

As further shown in FIG. 6, process 600 may include generating a second reference signal having a second frequency based on the subtiming signal (block 630). For example, the second reference signal generator 306 of the reference signal circuit 300 may generate a second reference signal having a second frequency based on the subtiming signal, as described above.

As further shown in FIG. 6, process 600 may include driving a first oscillation of a scanning system at the first frequency based on the first reference signal (block 640). For example, the first MEMS driver 114 of the MEMS driver system 104 may drive a first oscillation of a scanning system at the first frequency based on the first reference signal, as described above.

As further shown in FIG. 6, process 600 may include driving a second oscillation of the scanning system at the second frequency based on the second reference signal, wherein the first frequency and the second frequency define a fixed frequency ratio (block 650). For example, the second MEMS driver 116 of the MEMS driver system 104 may drive a second oscillation of the scanning system at the second frequency based on the second reference signal, wherein the first frequency and the second frequency define a fixed frequency ratio, as described above.

Process 600 may include additional implementations, such as any single implementation or any combination of implementations described above and/or in connection with one or more other processes described elsewhere herein.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

The following provides an overview of some Aspects of the present disclosure:

Aspect 1: A scanning system, comprising: an oscillator structure configured to oscillate about a first axis according to a first oscillation and oscillate about a second axis according to a second oscillation; a reference signal circuit comprising: a digitally controlled oscillator (DCO) configured with a DCO period and configured to divide the DCO period into a plurality of equidistant slices and generate a subtiming signal that indicates the plurality of equidistant slices; a first reference signal generator configured to receive the subtiming signal and generate a first reference signal having a first frequency based on the subtiming signal; and a second reference signal generator configured to receive the subtiming signal and generate a second reference signal having a second frequency based on the subtiming signal; and a driver system configured to receive the first reference signal and the second reference signal, drive the first oscillation of the oscillator structure at the first frequency based on the first reference signal, and drive the second oscillation of the oscillator structure at the second frequency based on the second reference signal.

Aspect 2: The scanning system of Aspect 1, wherein the driver system comprises: a first driver configured to generate a first driving signal to synchronize the first oscillation of the oscillator structure with the first frequency of the first reference signal; and a second driver configured to generate a second driving signal to synchronize the second oscillation of the oscillator structure with the second frequency of the second reference signal. a first driver configured to generate a first driving signal to synchronize the first oscillation of the oscillator structure with the first frequency of the first reference signal; and a second driver configured to generate a second driving signal to synchronize the second oscillation of the oscillator structure with the second frequency of the second reference signal.

Aspect 3: The scanning system of any of Aspects 1-2, wherein the first reference signal generator and the second reference signal generator are configured to synchronize the first reference signal and the second reference signal to the subtiming signal, respectively, and are configured to set a fixed frequency ratio between the first frequency and the second frequency.

Aspect 4: The scanning system of any of Aspects 1-3, wherein the reference signal circuit is configured to set a fixed frequency ratio between the first frequency and the second frequency.

Aspect 5: The scanning system of Aspect 4, wherein the reference signal circuit is configured to set the first frequency and the second frequency as different frequencies.

Aspect 6: The scanning system of any of Aspects 1-5, wherein the subtiming signal is a periodic signal having a period equal to the DCO period, wherein the subtiming signal comprises a plurality of subtiming values, wherein each period of the subtiming signal is defined by a predetermined number of subtiming values, and wherein each subtiming value of the plurality of subtiming values indicates a respective equidistant slice of the plurality of equidistant slices.

Aspect 7: The scanning system of Aspect 6, wherein the subtiming signal has a saw-tooth waveform.

Aspect 8: The scanning system of Aspect 6, wherein: the first reference signal has a first plurality of transition edges that define the first frequency, the first reference signal generator is configured to trigger a different one of the first plurality of transition edges at every N consecutive subtiming values of the plurality of subtiming values, wherein N is a first integer greater than zero, the second reference signal has a second plurality of transition edges that define the second frequency, and the second reference signal generator is configured to trigger a different one of the second plurality of transition edges at every M consecutive subtiming values of the plurality of subtiming values, wherein M is a second integer greater than zero, and wherein the first integer and the second integer are different.

Aspect 9: The scanning system of any of Aspects 1-8, wherein the subtiming signal comprises a plurality of pulses that indicate the plurality of equidistant slices, wherein each period of the subtiming signal is defined by a predetermined number of pulses, wherein each pulse of the plurality of pulses indicates a respective equidistant slice of the plurality of equidistant slices.

Aspect 10: The scanning system of Aspect 9, wherein: the first reference signal has a first plurality of transition edges that define the first frequency, the first reference signal generator is configured to trigger a different one of the first plurality of transition edges at every N consecutive pulses of the plurality of pulses, wherein N is a first integer greater than zero, the second reference signal has a second plurality of transition edges that define the second frequency, and the second reference signal generator is configured to trigger a different one of the second plurality of transition edges at every M consecutive pulses of the plurality of pulses, wherein M is a second integer greater than zero, and wherein the first integer and the second integer are different.

Aspect 11: The scanning system of any of Aspects 1-10, wherein: the first reference signal has a first plurality of transition edges that define the first frequency, the first reference signal generator is configured to trigger a different one of the first plurality of transition edges at every N consecutive equidistant slices of the plurality of equidistant slices, wherein N is a first integer greater than zero, the second reference signal has a second plurality of transition edges that define the second frequency, and the second reference signal generator is configured to trigger a different one of the second plurality of transition edges at every M consecutive equidistant slices of the plurality of equidistant slices, wherein M is a second integer greater than zero, and wherein the first integer and the second integer are different.

Aspect 12: The scanning system of any of Aspects 1-11, further comprising: a light transmitter configured to transmit at least one light beam, wherein the oscillator structure is configured to steer the at least one light beam according to a scanning pattern defined by the first oscillation and the second oscillation. wherein the oscillator structure is configured to steer the at least one light beam according to a scanning pattern defined by the first oscillation and the second oscillation.

Aspect 13: The scanning system of Aspect 12, wherein the scanning pattern is a Lissajous scanning pattern.

Aspect 14: The scanning system of any of Aspects 1-13, wherein the oscillator structure is a microelectromechanical system (MEMS) mirror.

Aspect 15: A scanning system, comprising: a first oscillator structure configured to oscillate about a first axis according to a first oscillation; a second oscillator structure configured to oscillate about a second axis according to a second oscillation; a reference signal circuit comprising: a digitally controlled oscillator (DCO) configured with a DCO period and configured to divide the DCO period into a plurality of equidistant slices and generate a subtiming signal that indicates the plurality of equidistant slices; a first reference signal generator configured to receive the subtiming signal and generate a first reference signal having a first frequency based on the subtiming signal; and a second reference signal generator configured to receive the subtiming signal and generate a second reference signal having a second frequency based on the subtiming signal; and a driver system configured to receive the first reference signal and the second reference signal, drive the first oscillation of the first oscillator structure at the first frequency based on the first reference signal, and drive the second oscillation of the second oscillator structure at the second frequency based on the second reference signal.

Aspect 16: The scanning system of Aspect 15, wherein the reference signal circuit is configured to set a fixed frequency ratio between the first frequency and the second frequency.

Aspect 17: The scanning system of any of Aspects 15-16, wherein: the first reference signal has a first plurality of transition edges that define the first frequency, the first reference signal generator is configured to trigger a different one of the first plurality of transition edges at every N consecutive equidistant slices of the plurality of equidistant slices, wherein N is a first integer greater than zero, the second reference signal has a second plurality of transition edges that define the second frequency, and the second reference signal generator is configured to trigger a different one of the second plurality of transition edges at every M consecutive equidistant slices of the plurality of equidistant slices, wherein M is a second integer greater than zero, and wherein the first integer and the second integer are different.

Aspect 18: A method, comprising: generating, by a digitally controlled oscillator (DCO), a subtiming signal that indicates a plurality of equidistant slices of a DCO period of the DCO; generating, by a reference signal circuit, a first reference signal having a first frequency based on the subtiming signal; generating, by the reference signal circuit, a second reference signal having a second frequency based on the subtiming signal; driving, by a driver system, a first oscillation of a scanning system at the first frequency based on the first reference signal; and driving, by the driver system, a second oscillation of the scanning system at the second frequency based on the second reference signal, wherein the first frequency and the second frequency define a fixed frequency ratio.

Aspect 19: The method of Aspect 18, wherein: the first reference signal has a first plurality of transition edges that define the first frequency, and the second reference signal has a second plurality of transition edges that define the second frequency, the method further comprises: triggering a different one of the first plurality of transition edges at every N consecutive equidistant slices of the plurality of equidistant slices, wherein N is a first integer greater than zero; and triggering a different one of the second plurality of transition edges at every M consecutive equidistant slices of the plurality of equidistant slices, wherein M is a second integer greater than zero, and wherein the first integer and the second integer are different. triggering a different one of the first plurality of transition edges at every N consecutive equidistant slices of the plurality of equidistant slices, wherein N is a first integer greater than zero; and triggering a different one of the second plurality of transition edges at every M consecutive equidistant slices of the plurality of equidistant slices, wherein M is a second integer greater than zero, and wherein the first integer and the second integer are different.

Aspect 20: The method of any of Aspects 18-19, wherein the subtiming signal is a periodic signal having a period equal to the DCO period, wherein the subtiming signal comprises a plurality of subtiming values, wherein each period of the subtiming signal is defined by a predetermined number of subtiming values, and wherein each subtiming value of the plurality of subtiming values indicates a respective equidistant slice of the plurality of equidistant slices.

Aspect 21: The method of any of Aspects 18-20, wherein the subtiming signal comprises a plurality of pulses that indicate the plurality of equidistant slices, wherein each period of the subtiming signal is defined by a predetermined number of pulses, wherein each pulse of the plurality of pulses indicates a respective equidistant slice of the plurality of equidistant slices.

Aspect 22: A reference signal circuit, comprising: a digitally controlled oscillator (DCO) configured with a DCO period and configured to divide the DCO period into a plurality of slices and generate a subtiming signal that indicates the plurality of slices; a first reference signal generator configured to receive the subtiming signal and generate a first reference signal having a first frequency based on the subtiming signal; and a second reference signal generator configured to receive the subtiming signal and generate a second reference signal having a second frequency based on the subtiming signal, wherein the first reference signal generator and the second reference signal generator are configured to synchronize the first reference signal and the second reference signal to the subtiming signal, respectively, and are configured to set a first fixed frequency ratio between the first frequency and the second frequency.

Aspect 23: The reference signal circuit of Aspect 22, further comprising: a third reference signal generator configured to receive the subtiming signal and generate a third reference signal having a third frequency based on the subtiming signal, wherein the third reference signal generator is configured to synchronize the third reference signal to the subtiming signal, wherein the first reference signal generator and the third reference signal generator are configured to set a second fixed frequency ratio between the first frequency and the third frequency, and wherein the second reference signal generator and the third reference signal generator are configured to set a third fixed frequency ratio between the second frequency and the third frequency. wherein the third reference signal generator is configured to synchronize the third reference signal to the subtiming signal, wherein the first reference signal generator and the third reference signal generator are configured to set a second fixed frequency ratio between the first frequency and the third frequency, and wherein the second reference signal generator and the third reference signal generator are configured to set a third fixed frequency ratio between the second frequency and the third frequency.

Aspect 24: The reference signal circuit of Aspect 23, wherein: the first reference signal has a first plurality of transition edges that define the first frequency, the first reference signal generator is configured to trigger a different one of the first plurality of transition edges at every N consecutive slices of the plurality of slices, wherein N is a first integer greater than zero, the second reference signal has a second plurality of transition edges that define the second frequency, the second reference signal generator is configured to trigger a different one of the second plurality of transition edges at every M consecutive slices of the plurality of slices, wherein M is a second integer greater than zero, the third reference signal has a third plurality of transition edges that define the third frequency, and the third reference signal generator is configured to trigger a different one of the third plurality of transition edges at every K consecutive slices of the plurality of slices, wherein K is a third integer greater than zero.

Aspect 25: The reference signal circuit of any of Aspects 22-24, wherein: the first reference signal has a first plurality of transition edges that define the first frequency, the first reference signal generator is configured to trigger a different one of the first plurality of transition edges at every N consecutive slices of the plurality of slices, wherein N is a first integer greater than zero, the second reference signal has a second plurality of transition edges that define the second frequency, and the second reference signal generator is configured to trigger a different one of the second plurality of transition edges at every M consecutive slices of the plurality of slices, wherein M is a second integer greater than zero.

Aspect 26: The reference signal circuit of any of Aspects 22-25, wherein the plurality of slices are phase slices of the DCO period.

Aspect 27: A system configured to perform one or more operations recited in one or more of Aspects 1-26.

Aspect 28: An apparatus comprising means for performing one or more operations recited in one or more of Aspects 1-26.

Aspect 29: A non-transitory computer-readable medium storing a set of instructions, the set of instructions comprising one or more instructions that, when executed by a device, cause the device to perform one or more operations recited in one or more of Aspects 1-26.

Aspect 30: A computer program product comprising instructions or code for executing one or more operations recited in one or more of Aspects 1-26.

The foregoing disclosure provides illustration and description, but is not intended to be exhaustive or to limit the implementations to the precise form disclosed. Modifications and variations are possible in light of the above disclosure or may be acquired from practice of the implementations.

For example, although implementations described herein relate to MEMS devices with a mirror, it is to be understood that other implementations may include optical devices other than MEMS mirror devices or other MEMS oscillating structures. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer, or an electronic circuit.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPLAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software executing on hardware, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A scanning system, comprising:
    an oscillator structure configured to oscillate about a first axis according to a first oscillation and oscillate about a second axis according to a second oscillation;
    a reference signal circuit comprising:
        a digitally controlled oscillator (DCO) configured with a DCO period and configured to divide the DCO period into a plurality of equidistant slices and generate a subtiming signal that indicates the plurality of equidistant slices;
        a first reference signal generator configured to receive the subtiming signal and generate a first reference signal having a first frequency based on the subtiming signal; and
        a second reference signal generator configured to receive the subtiming signal and generate a second reference signal having a second frequency based on the subtiming signal; and
    a driver system configured to receive the first reference signal and the second reference signal, drive the first oscillation of the oscillator structure at the first frequency based on the first reference signal, and drive the second oscillation of the oscillator structure at the second frequency based on the second reference signal.

2. The scanning system of claim 1, wherein the driver system comprises:
a first driver configured to generate a first driving signal to synchronize the first oscillation of the oscillator structure with the first frequency of the first reference signal; and
a second driver configured to generate a second driving signal to synchronize the second oscillation of the oscillator structure with the second frequency of the second reference signal.

3. The scanning system of claim 1, wherein the first reference signal generator and the second reference signal generator are configured to synchronize the first reference signal and the second reference signal to the subtiming signal, respectively, and are configured to set a fixed frequency ratio between the first frequency and the second frequency.

4. The scanning system of claim 1, wherein the reference signal circuit is configured to set a fixed frequency ratio between the first frequency and the second frequency.

5. The scanning system of claim 4, wherein the reference signal circuit is configured to set the first frequency and the second frequency as different frequencies.

6. The scanning system of claim 1, wherein the subtiming signal is a periodic signal having a period equal to the DCO period, wherein the subtiming signal comprises a plurality of subtiming values, wherein each period of the subtiming signal is defined by a predetermined number of subtiming values, and wherein each subtiming value of the plurality of subtiming values indicates a respective equidistant slice of the plurality of equidistant slices.

7. The scanning system of claim 6, wherein the subtiming signal has a saw-tooth waveform.

8. The scanning system of claim 6, wherein:
the first reference signal has a first plurality of transition edges that define the first frequency,
the first reference signal generator is configured to trigger a different one of the first plurality of transition edges at every N consecutive subtiming values of the plurality of subtiming values, wherein N is a first integer greater than zero,
the second reference signal has a second plurality of transition edges that define the second frequency, and
the second reference signal generator is configured to trigger a different one of the second plurality of transition edges at every M consecutive subtiming values of the plurality of subtiming values, wherein M is a second integer greater than zero, and wherein the first integer and the second integer are different.

9. The scanning system of claim 1, wherein the subtiming signal comprises a plurality of pulses that indicate the plurality of equidistant slices, wherein each period of the subtiming signal is defined by a predetermined number of pulses, wherein each pulse of the plurality of pulses indicates a respective equidistant slice of the plurality of equidistant slices.

10. The scanning system of claim 9, wherein:
the first reference signal has a first plurality of transition edges that define the first frequency,
the first reference signal generator is configured to trigger a different one of the first plurality of transition edges at every N consecutive pulses of the plurality of pulses, wherein N is a first integer greater than zero,
the second reference signal has a second plurality of transition edges that define the second frequency, and
the second reference signal generator is configured to trigger a different one of the second plurality of transition edges at every M consecutive pulses of the plurality of pulses, wherein M is a second integer greater than zero, and wherein the first integer and the second integer are different.

11. The scanning system of claim 1, wherein:
the first reference signal has a first plurality of transition edges that define the first frequency,
the first reference signal generator is configured to trigger a different one of the first plurality of transition edges at every N consecutive equidistant slices of the plurality of equidistant slices, wherein N is a first integer greater than zero,
the second reference signal has a second plurality of transition edges that define the second frequency, and
the second reference signal generator is configured to trigger a different one of the second plurality of transition edges at every M consecutive equidistant slices of the plurality of equidistant slices, wherein M is a second integer greater than zero, and wherein the first integer and the second integer are different.

12. The scanning system of claim 1, further comprising:
a light transmitter configured to transmit at least one light beam,
wherein the oscillator structure is configured to steer the at least one light beam according to a scanning pattern defined by the first oscillation and the second oscillation.

13. The scanning system of claim 12, wherein the scanning pattern is a Lissajous scanning pattern.

14. The scanning system of claim 1, wherein the oscillator structure is a microelectromechanical system (MEMS) mirror.

15. A scanning system, comprising:
a first oscillator structure configured to oscillate about a first axis according to a first oscillation;
a second oscillator structure configured to oscillate about a second axis according to a second oscillation;
a reference signal circuit comprising:
a digitally controlled oscillator (DCO) configured with a DCO period and configured to divide the DCO period into a plurality of equidistant slices and generate a subtiming signal that indicates the plurality of equidistant slices;
a first reference signal generator configured to receive the subtiming signal and generate a first reference signal having a first frequency based on the subtiming signal; and
a second reference signal generator configured to receive the subtiming signal and generate a second reference signal having a second frequency based on the subtiming signal; and
a driver system configured to receive the first reference signal and the second reference signal, drive the first oscillation of the first oscillator structure at the first frequency based on the first reference signal, and drive the second oscillation of the second oscillator structure at the second frequency based on the second reference signal.

16. The scanning system of claim 15, wherein the reference signal circuit is configured to set a fixed frequency ratio between the first frequency and the second frequency.

17. The scanning system of claim 15, wherein:
the first reference signal has a first plurality of transition edges that define the first frequency,
the first reference signal generator is configured to trigger a different one of the first plurality of transition edges at every N consecutive equidistant slices of the plurality of equidistant slices, wherein N is a first integer greater than zero, the second reference signal has a second plurality of transition edges that define the second frequency, and the second reference signal generator is configured to trigger a different one of the second plurality of transition edges at every M consecutive equidistant slices of the plurality of equidistant slices, wherein M is a second integer greater than zero, and wherein the first integer and the second integer are different.

18. A method, comprising:

generating, by a digitally controlled oscillator (DCO), a subtiming signal that indicates a plurality of equidistant slices of a DCO period of the DCO;

generating, by a reference signal circuit, a first reference signal having a first frequency based on the subtiming signal;

generating, by the reference signal circuit, a second reference signal having a second frequency based on the subtiming signal;

driving, by a driver system, a first oscillation of a scanning system at the first frequency based on the first reference signal; and driving, by the driver system, a second oscillation of the scanning system at the second frequency based on the second reference signal, wherein the first frequency and the second frequency define a fixed frequency ratio.

19. The method of claim 18, wherein:

the first reference signal has a first plurality of transition edges that define the first frequency, and the second reference signal has a second plurality of transition edges that define the second frequency, and the method further comprises:

triggering a different one of the first plurality of transition edges at every N consecutive equidistant slices of the plurality of equidistant slices, wherein N is a first integer greater than zero; and triggering a different one of the second plurality of transition edges at every M consecutive equidistant slices of the plurality of equidistant slices, wherein M is a second integer greater than zero, and wherein the first integer and the second integer are different.

20. The method of claim 18, wherein the subtiming signal is a periodic signal having a period equal to the DCO period, wherein the subtiming signal comprises a plurality of subtiming values, wherein each period of the subtiming signal is defined by a predetermined number of subtiming values, and wherein each subtiming value of the plurality of subtiming values indicates a respective equidistant slice of the plurality of equidistant slices.

21. The method of claim 18, wherein the subtiming signal comprises a plurality of pulses that indicate the plurality of equidistant slices, wherein each period of the subtiming signal is defined by a predetermined number of pulses, wherein each pulse of the plurality of pulses indicates a respective equidistant slice of the plurality of equidistant slices.

22. A reference signal circuit, comprising:

a digitally controlled oscillator (DCO) configured with a DCO period and configured to divide the DCO period into a plurality of slices and generate a subtiming signal that indicates the plurality of slices;

a first reference signal generator configured to receive the subtiming signal and generate a first reference signal having a first frequency based on the subtiming signal; and a second reference signal generator configured to receive the subtiming signal and generate a second reference signal having a second frequency based on the subtiming signal, wherein the first reference signal generator and the second reference signal generator are configured to synchronize the first reference signal and the second reference signal to the subtiming signal, respectively, and are configured to set a first fixed frequency ratio between the first frequency and the second frequency.

23. The reference signal circuit of claim 22, further comprising:

a third reference signal generator configured to receive the subtiming signal and generate a third reference signal having a third frequency based on the subtiming signal, wherein the third reference signal generator is configured to synchronize the third reference signal to the subtiming signal, wherein the first reference signal generator and the third reference signal generator are configured to set a second fixed frequency ratio between the first frequency and the third frequency, and wherein the second reference signal generator and the third reference signal generator are configured to set a third fixed frequency ratio between the second frequency and the third frequency.

24. The reference signal circuit of claim 23, wherein:

the first reference signal has a first plurality of transition edges that define the first frequency, the first reference signal generator is configured to trigger a different one of the first plurality of transition edges at every N consecutive slices of the plurality of slices, wherein N is a first integer greater than zero, the second reference signal has a second plurality of transition edges that define the second frequency, the second reference signal generator is configured to trigger a different one of the second plurality of transition edges at every M consecutive slices of the plurality of slices, wherein M is a second integer greater than zero, the third reference signal has a third plurality of transition edges that define the third frequency, and the third reference signal generator is configured to trigger a different one of the third plurality of transition edges at every K consecutive slices of the plurality of slices, wherein K is a third integer greater than zero.

25. The reference signal circuit of claim 22, wherein:

the first reference signal has a first plurality of transition edges that define the first frequency, the first reference signal generator is configured to trigger a different one of the first plurality of transition edges at every N consecutive slices of the plurality of slices, wherein N is a first integer greater than zero, the second reference signal has a second plurality of transition edges that define the second frequency, and the second reference signal generator is configured to trigger a different one of the second plurality of transition edges at every M consecutive slices of the plurality of slices, wherein M is a second integer greater than zero.

26. The reference signal circuit of claim 22, wherein the plurality of slices are phase slices of the DCO period.

* * * * *